(12) United States Patent
Miura

(10) Patent No.: US 11,050,178 B2
(45) Date of Patent: Jun. 29, 2021

(54) CONTACT PIN AND ELECTRIC COMPONENT SOCKET

(71) Applicant: ENPLAS CORPORATION, Kawaguchi (JP)

(72) Inventor: Akira Miura, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 16/312,774

(22) PCT Filed: Jun. 27, 2017

(86) PCT No.: PCT/JP2017/023632
§ 371 (c)(1),
(2) Date: Dec. 21, 2018

(87) PCT Pub. No.: WO2018/003816
PCT Pub. Date: Jan. 4, 2018

(65) Prior Publication Data
US 2019/0173217 A1    Jun. 6, 2019

(30) Foreign Application Priority Data

Jun. 28, 2016    (JP) .............................. JP2016-127915

(51) Int. Cl.
*H01R 13/24* (2006.01)
*G01R 1/073* (2006.01)
(Continued)

(52) U.S. Cl.
CPC ......... *H01R 13/2421* (2013.01); *G01R 1/067* (2013.01); *G01R 1/06722* (2013.01);
(Continued)

(58) Field of Classification Search
CPC .... H01R 23/722; H01R 23/725; H01R 9/096; H01R 13/2421; H01R 13/2428;
(Continued)

(56) References Cited

U.S. PATENT DOCUMENTS

| 5,388,997 | A | * | 2/1995 | Grange | .............. | H01R 13/2421 |
| | | | | | | 347/50 |
| 6,604,864 | B2 | * | 8/2003 | Nguyen | .............. | G02B 6/3821 |
| | | | | | | 385/59 |

(Continued)

FOREIGN PATENT DOCUMENTS

| JP | 2008-96368 | 4/2008 |
| JP | 2010-38837 | 2/2010 |

(Continued)

OTHER PUBLICATIONS

International Search Report dated Sep. 19, 2017, in corresponding International Patent Application No. PCT/JP2017/023632.

(Continued)

*Primary Examiner* — Gary F Paumen
(74) *Attorney, Agent, or Firm* — Staas & Halsey LLP

(57) ABSTRACT

Embodiments implement rotation stoppage for a contact pin at a lower cost, in which the contact pin is disposed in a socket main body to establish electrical conduction between an IC package and a wiring board. The contact pin has a barrel, an upper contact member, a lower contact member, and a coil spring. The barrel has a flange that has rotation stoppers protruding in the horizontal direction. When the contact pin is disposed in a socket main body, the rotation stoppers of the flange are brought into contact with the socket main body, whereby the barrel is restrained from rotating relative to the socket main body.

7 Claims, 6 Drawing Sheets

(51) Int. Cl.
*G01R 1/067* (2006.01)
*G01R 31/26* (2020.01)
*H01R 12/71* (2011.01)

(52) U.S. Cl.
CPC ......... *G01R 1/06738* (2013.01); *G01R 1/073* (2013.01); *G01R 1/07314* (2013.01); *G01R 31/26* (2013.01); *H01R 12/714* (2013.01)

(58) Field of Classification Search
CPC ...... H01R 12/714; G01R 1/073; G01R 1/067; G01R 1/06722; G01R 1/06738; G01R 1/07314; G01R 31/26
USPC .................................. 439/66, 74, 700, 752.5
See application file for complete search history.

(56) References Cited

U.S. PATENT DOCUMENTS

| | | | | |
|---|---|---|---|---|
| 6,994,598 B2* | 2/2006 | Holmes | .............. | H01R 13/4361 439/752 |
| 7,845,988 B2* | 12/2010 | Hsiao | ................ | H01R 13/2421 439/66 |
| 8,066,534 B1* | 11/2011 | Lin | .................... | H01R 13/2421 439/700 |
| 8,506,307 B2* | 8/2013 | Henry | ................ | G01R 1/06738 439/66 |
| 8,758,066 B2* | 6/2014 | Zhou | .................. | G01R 1/06722 439/700 |
| 8,911,266 B2* | 12/2014 | Kawate | ................ | G01R 1/0483 439/700 |
| 9,882,301 B1* | 1/2018 | Emaci | .................... | H01R 13/53 |
| 2008/0003888 A1* | 1/2008 | Xu | ..................... | H01R 13/2421 439/700 |
| 2009/0221189 A1* | 9/2009 | Xu | ..................... | H01R 13/2421 439/700 |
| 2011/0050264 A1* | 3/2011 | Kurosawa | .......... | G01R 1/07314 324/756.02 |
| 2014/0049278 A1* | 2/2014 | Trenz | ................ | G01R 1/07314 324/750.25 |
| 2015/0280344 A1* | 10/2015 | Henry | ................ | G01R 1/0466 439/700 |

FOREIGN PATENT DOCUMENTS

| | | |
|---|---|---|
| JP | 2011-21900 | 2/2011 |
| JP | 2011-53035 | 3/2011 |
| JP | 2013-167601 | 8/2013 |
| JP | 2014-25789 | 2/2014 |
| JP | 2014-38100 | 2/2014 |

OTHER PUBLICATIONS

International Written Opinion dated Sep. 19, 2017, in corresponding International Patent Application No. PCT/JP2017/023632.

* cited by examiner

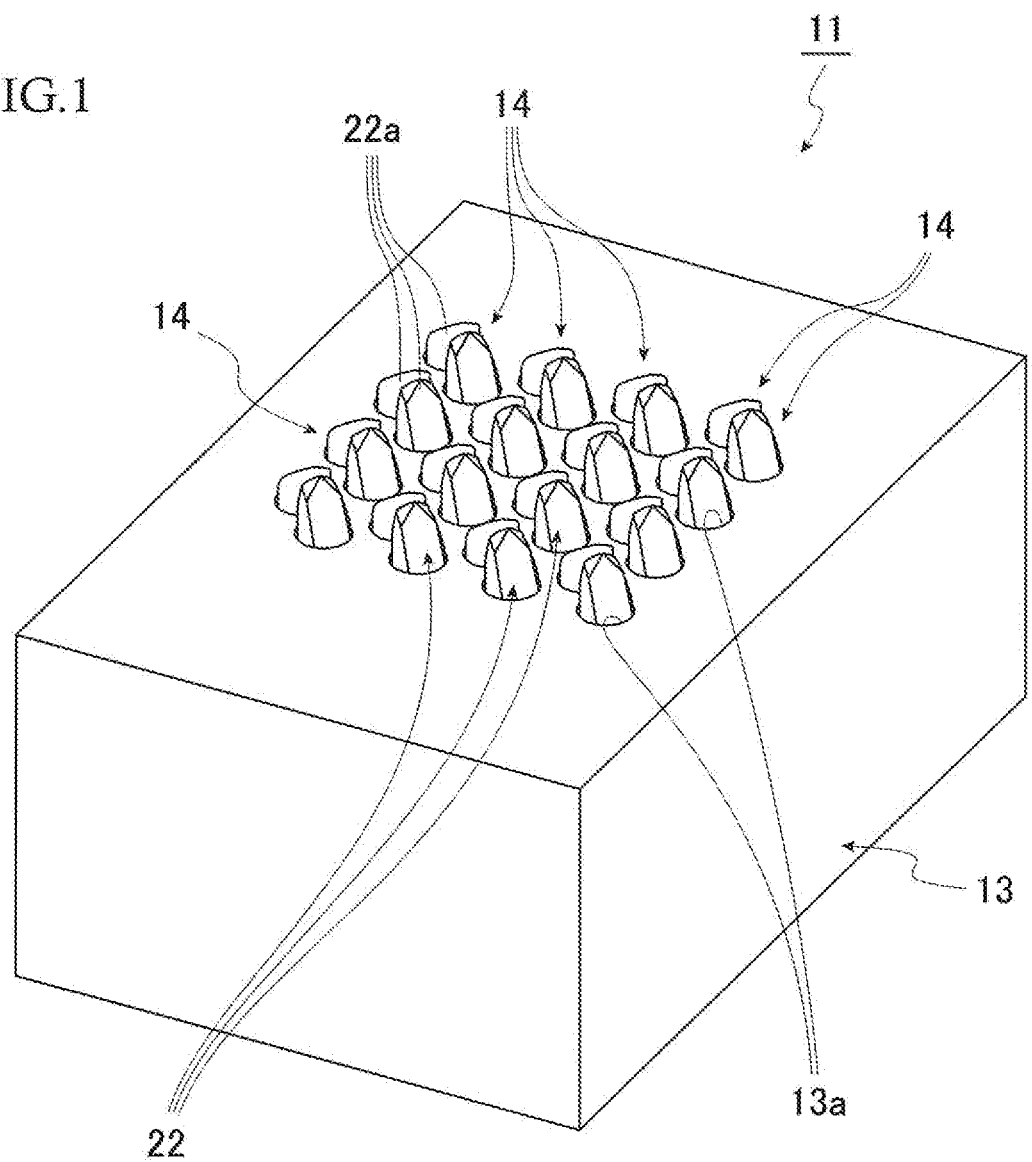

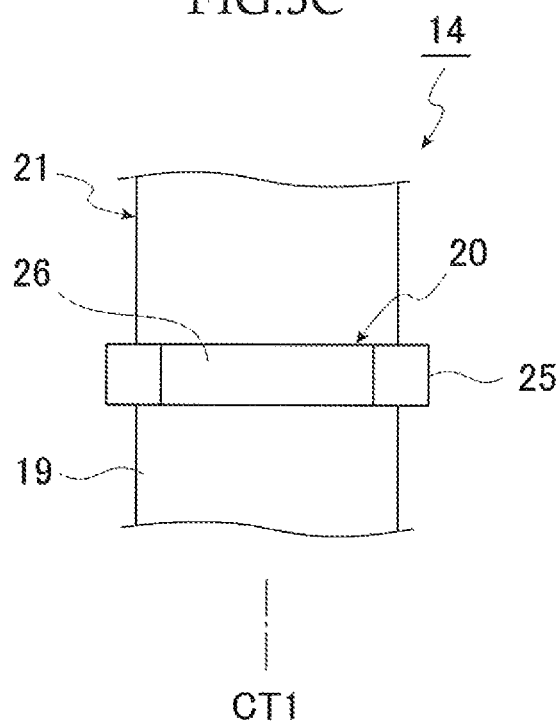

CONTACT PIN AND ELECTRIC COMPONENT SOCKET

CROSS-REFERENCE TO RELATED APPLICATIONS

This application is a U.S. National Stage Application which claims the benefit under 35 U.S.C. § 371 of PCT International Patent Application No. PCT/JP2017/023632, filed Jun. 27, 2017, which claims the foreign priority benefit under 35 U.S.C. § 119 of Japanese Patent Application No. 2016-127915, filed Jun. 28, 2016, the contents of which are incorporated herein by reference.

TECHNICAL FIELD

The present invention relates to contact pins for electrical connection between electric components, such as semiconductor devices (hereinafter referred to as "IC packages"), and wiring boards by means of Kelvin connection (four-terminal connection), and electric component sockets having such contact pins. The present invention is preferably applied to contact pins and electric component sockets for use in burn-in test of electric components.

BACKGROUND ART

Kelvin inspection jigs that removably hold IC packages have been conventionally proposed as "electric component sockets" employing Kelvin connection (see Patent Literature 1, for example).

Such a Kelvin inspection jig includes a plurality of pairs of contact pins mounted on a socket main body. Each pair of contact pins is brought into contact with one terminal of an IC package. Each contact pin has a cylindrical tube having a plunger on the upper end of the tube and an abutment member on the lower end of the tube. The plunger and the abutment member are urged by a coil spring in respective mutually separating directions.

Further, the plunger includes a discal flange and a tip end-side main body shaped like a knife and formed on the upper side of the flange. The tip end-side main body is formed at a position eccentric to the central axis of the flange. The socket main body has a through hole shaped in accordance with the shape of the plunger and the tip end-side main body. This arrangement enables to prevent insertion of a contact pin into a socket main body so as to rotate in a wrong rotation direction when assembling Kevin inspection jigs and/or exchange of contact pins and also to prevent rotation of the tip end-side main body of the plunger during inspection.

CITATION LIST

Patent Literature

Patent Literature 1: Japanese Patent Laid-open Publication No. 2010-38837

SUMMARY OF INVENTION

Technical Problem

As described above, in manufacturing of conventional Kevin inspection jigs, it is necessary to form the flange of the plunger and the tip end-side main body of each contact pin so as to be eccentric to each other, and also to form a through hole shaped in accordance with the shape of the plunger and the tip end-side main body. As a result, this inevitably increases the labor and time required in manufacturing of the contact pins and socket main bodies, which results in a problem of an increased manufacturing cost of Kelvin inspection gigs.

In view of the above, it is an object of the present invention to provide contact pins and electric component sockets that can be manufactured at a lower cost, in which rotation stoppage for the contact pins is achieved.

Solution to Problem

In order to achieve the above described object, a contact pin according to the present invention includes a barrel having a flange formed on the outer circumference of a barrel body; an upper contact member provided to one opening of the barrel body of the barrel so as not to rotate; and a lower contact member provided to another opening of the barrel body of the barrel, wherein the flange has a rotation stopper that protrudes in the horizontal direction, and when the contact pin is disposed in a socket main body, the rotation stopper of the flange is brought into contact with the wall surface of the socket main body, whereby the barrel is restrained from rotating relative to the socket main body.

In the contact pin according to the present invention, it is desirable that at least one of the upper contact member and the lower contact member is movable in the up-down direction relative to the barrel, and that the contact pin further includes an urging member held inside the barrel body of the barrel, the urging member urging the upper contact member and the lower contact member in respective mutually separating directions.

In the contact pin according to the present invention, it is desirable that the socket main body includes a stepped portion on which the upper surface of the flange is to be abutted and a slit having an inner wall surface with which the rotation stopper of the flange is to be brought into contact, and that the flange is configured such that the flange abuts on the stepped portion of the socket main body to thereby regulate the upward movement of the upper contact member and that the rotation stopper of the flange abuts on the inner wall surface of the slip to thereby restrain the rotation of the barrel.

In the contact pin according to the present invention, it is desirable that the rotation stopper has a shape formed by cutting a portion off from the peripheral portion of the flange main body that has a substantially annular tabular shape.

In the contact pin according to the present invention, it is desirable that an upper contact portion is formed on the upper portion of the upper contact member, and that a lower contact portion is formed on the lower portion of the lower contact member.

In the contact pin according to the present invention, it is desirable that two of the rotation stoppers are formed at respective positions that hold a point symmetrical positional relationship relative to the center of the barrel.

An electric component socket according to the present invention is an electric component socket including a contact pin disposed in a socket main body, the contact pin including: a barrel having a flange formed on the outer circumference of a barrel body; an upper contact member provided to one opening of the barrel body of the barrel so as not to rotate; and a lower contact member provided to the other opening of the barrel body of the barrel, wherein the flange has a rotation stopper that protrudes in the horizontal direction, and when the contact pin is disposed in a socket main body, the rotation stopper of the flange is brought into contact with the wall surface of the socket main body, whereby the barrel is restrained from rotating relative to the socket main body.

In the electric component socket according to the present invention, it is desirable that at least one of the upper contact member and the lower contact member is movable in the up-down direction relative to the barrel, and that the contact pin further includes an urge member held inside the barrel body of the barrel, the urging member urging the upper contact member and the lower contact member in respective mutually separating directions.

In the electric component socket according to the present invention, it is desirable that the socket main body includes a stepped portion on which the upper surface of the flange is to be abutted and a slit having an inner wall surface with which the rotation stopper of the flange is to be brought into contact, and that the flange is configured such that the flange abuts on the stepped portion of the socket main body to thereby regulate the upward movement of the upper contact member and that the rotation stopper of the flange abuts on the inner wall surface of the slip to thereby restrain the rotation of the barrel.

In the electric component socket according to the present invention, it is desirable that a pair of contact pins are disposed so as to be parallel to each other in the socket main body so that the upper contact portions of the upper contact members of the contact pins are simultaneously brought into contact with the single terminal of an electric component.

In the electric component socket according to the present invention, it is desirable that each contact pin of the pair of the contact pins is disposed such that the rotation stoppers of the flange of the contact pin protrude in respective parallel directions.

In the electric component socket according to the present invention, it is desirable that the rotation stopper has a shape formed by cutting a portion off from the peripheral portion of the flange main body that has a substantially annular tabular shape.

In the electric component socket according to the present invention, it is desirable that an upper contact portion is formed on the upper portion of the upper contact member, and a lower contact portion is formed on the lower portion of the lower contact member.

In the electric component socket according to the present invention, it is desirable that two of the rotation stoppers are formed at respective positions that hold a point symmetrical positional relationship relative to the center of the barrel.

Advantageous Effects of Invention

According to the present invention, when a contact pin is disposed in a socket main body, the rotation stopper of the flange of the barrel of the contact pin is brought into contact with the socket main body, whereby the barrel is restrained from rotating relative to the socket main body. That is, it is possible to provide a contact pin having rotation stoppage.

Since such rotation stoppage for a contact pin is implemented through contriving the shape of the flange of the barrel, it is unnecessary to make the upper contact member and/or the lower contact member into a particular shape (a shape like a knife, for example) in manufacturing of a contact pin. Hence, it is possible to ensure a lower manufacturing cost of a contact pin.

In the contact pin according to the present invention, regulation of the upward movement of the upper contact member and restraining of the rotation of the contact pin are implemented using the same flange. This can simplify the structure of a contact pin.

In the contact pin according to the present invention, the rotation stopper has a shape formed by cutting a portion off from the peripheral portion of the substantially annular tabular flange main body. This enables formation of a rotation stopper in a simple process.

In the contact pin according to the present invention, two rotation stoppers are formed on the flange at respective positions that hold a point symmetrical positional relationship relative to the center of the barrel. This facilitates processing of the flange in manufacturing of a contact pin.

In an electric component socket according to the present invention, the rotation stopper of the flange of the barrel of a contact pin is brought into contact with the socket main body to thereby restrain rotation of the barrel relative to the socket main body. This can implement rotation stoppage for the contact pin.

Since this rotation stoppage for a contact pin is implemented through contriving the shape of the flange of the barrel, the rotation stoppage can be readily implemented by making the guide hole of the socket main body, where the upper contact member of the contact pin is to penetrate, so as to have a substantially round cross section in manufacturing of an electric component socket. This can ensure a lower manufacturing cost of an electric component socket.

In the contact pin according to the present invention, regulation of the upward movement of the upper contact member and restraining of the rotation of the contact pin are implemented using the same flange. This can simplify the structure of an electric component socket.

In the contact pin according to the present invention, the respective rotation stoppers of a pair of contact pins are brought into contact with the socket main body to thereby restrain rotation of the barrels relative to the socket main body. This can implement rotation stoppage for the contact pins.

Since this rotation stoppage for contact pins is implemented through contriving the shapes of the flanges of the respective barrels, the rotation stoppage can be readily implemented by making the respective guide holes of the socket main body, where the respective upper contact members of the pair of contact pins are to penetrate, so as to each have a substantially round cross section in manufacturing of an electric component socket. This can ensure a lower manufacturing cost of an electric component socket.

As the respective rotation stoppers of the flange of each of the contact pins of a pair of contact pins are disposed so as to be opposed to each other, it is possible to position the respective barrel bodies of the barrels close to each other.

In the electric component socket according to the present invention, the upper contact member of any of a plurality of contact pins is supported while penetrating in the guide hole of the socket main body, and the rotation stopper of the flange of the barrel of the contact pin is supported in contact with the slit. This can implement rotation stoppage for the contact pin.

Since this rotation stoppage for a contact pin is implemented through contriving the shape of the flange of the barrel, the rotation stoppage can be readily implemented by making the guide hole of the socket main body, where the upper contact member of the contact pin is to penetrate, so as to have a substantially round cross section in manufacturing of an electric component socket. Hence, this can ensure a lower manufacturing cost of an electric component socket.

In an electric component socket according to the present invention, the rotation stopper has a shape formed by cutting a portion off from the peripheral portion of the substantially annular tabular flange main body. This enables formation of a rotation stopper in a simple process.

In an electric component socket according to the present invention, two rotation stoppers of the flange are formed at respective positions that hold a point symmetrical positional relationship relative to the center of the barrel. This can facilitate processing of a flange in manufacturing of a contact pin.

BRIEF DESCRIPTION OF DRAWINGS

FIG. 1 is a perspective view of an IC socket according to a first embodiment of the present invention.

FIG. 3C is a side view of a contact pin according to the first embodiment.

DESCRIPTION OF EMBODIMENTS

Embodiments of the present invention will be described below.

First Embodiment

FIGS. 1 to 3C relate to a first embodiment of the present invention.

Figure 2A:
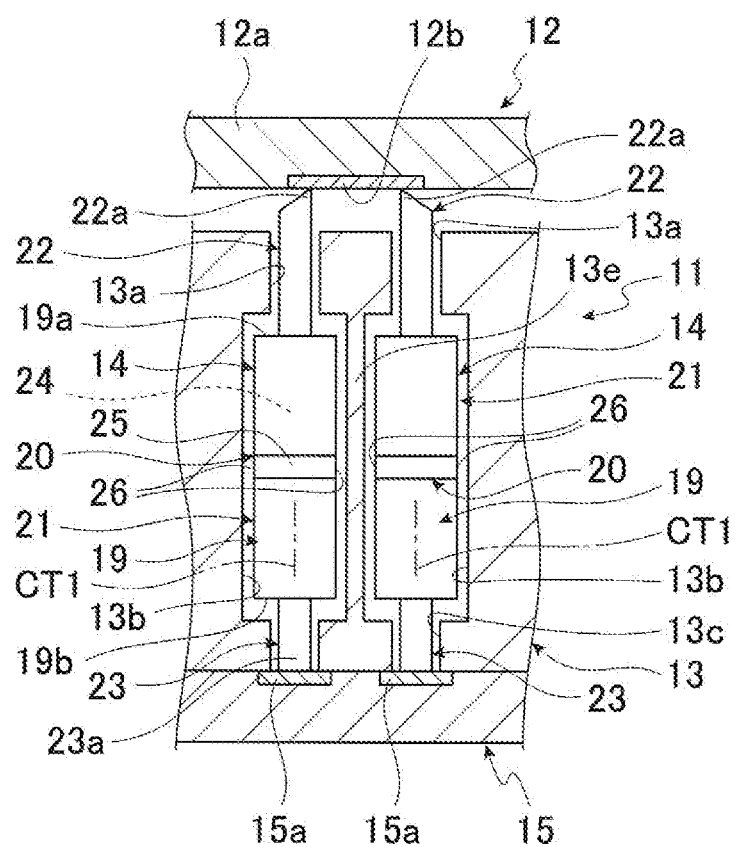
FIG. 2A is a vertical cross sectional view along the direction in which a pair of contact pins are aligned, and schematically illustrates an IC socket according to the first embodiment in use.
Figure 2B:
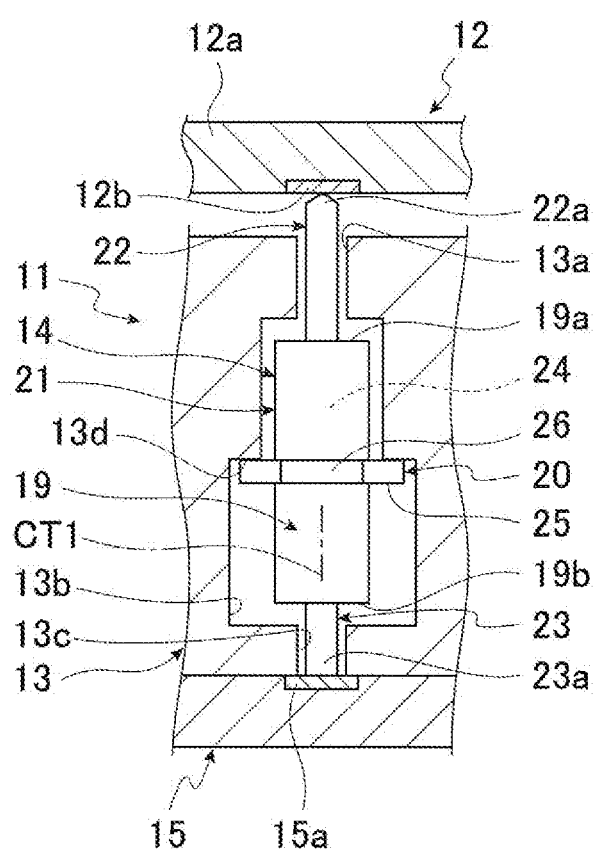
FIG. 2B is a vertical cross sectional view along a direction perpendicular to the direction of the cross section illustrated in FIG. 2A, and schematically illustrates the IC socket according to the first embodiment in use.

As illustrated in FIGS. 2A and 2B, an IC socket 11, or "an electric component socket" according to the first embodiment, is disposed on a wiring board 15, for example, for use in burn-in test of an IC package 12, for example, or an "electric component". The IC package 12 has terminals 12b, which are to be connected by means of Kelvin connection to a pair of electrodes 15a on the wiring board 15 via a pair of contact pins 14. For burn-in test through Kelvin connection, one of the two electrodes 15a of each pair of electrodes 15a of the wiring board 15 functions as a sense terminal, while the other functions as a force terminal.

As illustrated in FIGS. 2A and 2B, the IC package 12 has a tabular package body 12a having a plurality of terminals 12b formed on the lower surface of the package body 12a. Only one of the terminals 12b is illustrated in FIGS. 2A and 2B.

Meanwhile, as illustrated in FIGS. 1, 2A, and 2B, the IC socket 11 includes an insulating socket main body 13 and one or more (sixteen in FIG. 1) pairs of one-end slidable (cantilever) contact pins 14 held in the socket main body 13 so as to slide in the up-down direction. The IC packet 12 is to be placed on the upper side of the socket main body 13. Each pair of the contact pins 14, 14 is in contact with one terminal 12b of the IC package 12 and also a pair of electrodes 15a, 15a of the wiring board 15 to thereby achieve electrical conduction between the terminal 12b and the pair of electrodes 15a, 15a. Note that the socket main body 13 may have any of a variety of specific structures. For example, three to four plates (not illustrated) in a predetermined shape can be securely stacked one on the other in the up-down direction to thereby constitute the socket main body 13.

As illustrated in FIGS. 2A and 2B, each contact pin 14 has a barrel 21. The barrel 21 has a flange 20 formed on the outer circumferential surface of its barrel body 19. A substantially cylindrical upper contact member 22 is secured to one (the upper) opening 19a of the barrel body 19 of the barrel 21 so as not to rotate. Meanwhile, a substantially cylindrical lower contact member 23 is provided to the other (the lower) opening 19b of the barrel body 19 of the barrel 21 so as to move in the up-down direction. The barrel 21 has a coil spring 24, or an "urging means", held inside the barrel body 19. The coil spring 24 urges the upper contact member 22 and the lower contact member 23 in respective mutually separating directions (in the up and down respective opposite directions). The upper contact member 22 has an upper contact portion 22a formed on its upper portion. The lower contact member 23 has a lower contact portion 23a on its lower portion.

Figure 3A:
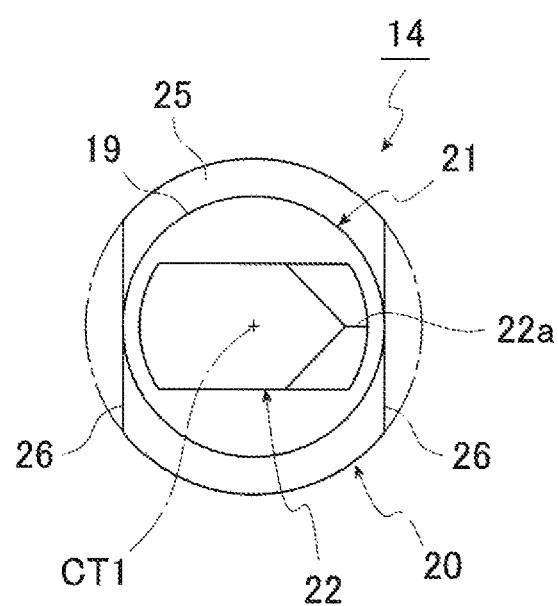
FIG. 3A is a plan view of a contact pin according to the first embodiment.
Figure 3B:
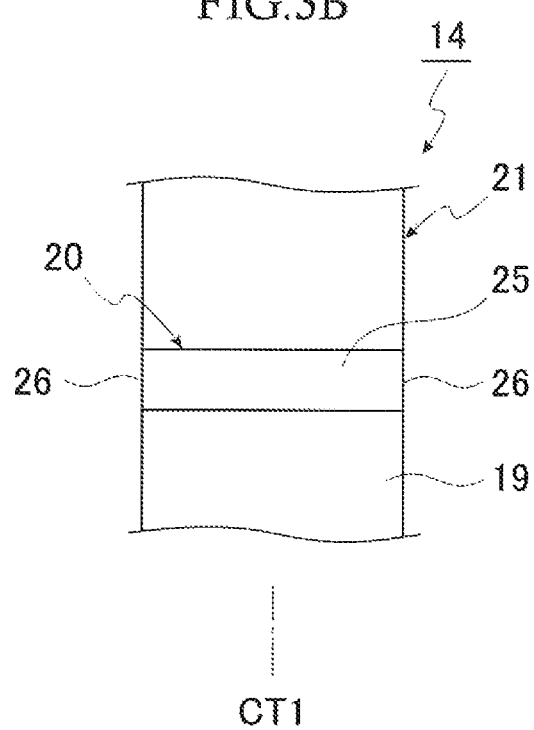
FIG. 3B is a front view of a contact pin according to the first embodiment.

As illustrated in FIGS. 2A, 2B, and 3A, the flange 20 on the barrel 21 of each contact pin 14 has two flat rotation stoppers 26 formed thereon. The two rotation stoppers 26 are formed so as to protrude in the horizontal direction at respective positions that hold a point symmetrical positional relationship relative to the center CT1 of the barrel 21. The rotation stoppers 26 have a shape formed by cutting a portion in an arcuate shape off from the peripheral portion of the substantially annular tabular flange main body 25 at two positions. In FIG. 3A, the arc portions outlined by alternate long and short dash lines (two portions) indicate the shape of the substantially annular tabular flange main body 25 before the peripheral portions are cut off. After the contact pin 14 is disposed in the socket main body 13, the respective rotation stoppers 26 of the flange 20 of the contact pin 14 are brought into contact with the inner wall surface of the slit 13b of the socket main body 13, whereby the barrel 21 is restrained from rotating relative to the socket main body 13.

As illustrated in FIGS. 2A and 2B, the socket main body 13 has an upper guide hole 13a, or "a guide hole", a slit 13b, and a lower guide hole 13c. The upper guide hole 13a has a substantially round cross section and guides the upper contact member 22 of each contact pin 14, penetrating therein, so as to move in the up-down direction. The slit 13b is touched by the rotation stopper 26 of the flange 20 of each contact pin 14. The lower guide hole 13c has a substantially round cross section and guides the lower contact member 23 of each contact pin 14, penetrating therein, so as to move in the up-down direction. Note that, for ease in understanding, the rotation stopper 26 of the flange 20 is illustrated spaced apart from the slit 13b of the socket main body 13.

As illustrated in FIG. 2A, a pair of contact pins 14 is disposed such that the rotation stoppers 26 of the flanges 20 of the respective contact pins 14 protrude in the horizontal direction with respect to each other. As illustrated in FIGS. 2A and 2B, the respective contact pins 14 are disposed in the socket main body 13 and supported in the socket main body 13 with the respective upper contact members 22 penetrating in the respective upper guide holes 13a and the respective lower contact members 23 penetrating in the respective lower guide holes 13c.

The manner of using such an IC socket 11 will be described below.

Initially, the IC socket 11 is disposed on the wiring board 15. Thereupon each contact pin 14 is pushed up by the wiring board 15 and thus elevates until the upper surface of the flange 20 on the barrel 21 reaches the stepped portion 13d of the socket main body 13, whereby the barrel 21 is restrained from moving further upward. Additionally, each lower contact member 23 is also pushed up by the wiring board 15 and thus moves upward relative to the barrel 21 against the urging force by the coil spring 24. Accordingly, as illustrated in FIG. 2A, in the IC socket 11, the lower contact portions 23a of the two lower contact members 23, 23 and the pair of electrodes 15a, 15a of the wiring board 15 are brought into contact with each other with a predetermined pushing force. This leaves the lower contact portions 23a and the electrodes 15a electrically connected to each other Subsequently, the IC packet 12 is placed to be seated on the upper side of the socket main body 13 of the IC socket 11, and pressed downward by an unillustrated pushing mechanism. Thereupon, the upper contact member 22 and the barrel 21 of each contact pin 14 are pushed downward by the IC packet 12 against the urging force of the coil spring 24. Accordingly, as illustrated in FIG. 2A, in the IC socket 11, the upper contact portions 22a, 22a of the two upper contact members 22, 22 and the single terminal 12b of the IC package 12 are brought into contact with each other with a predetermined pushing force. This leaves the upper contact portions 22a and the terminal 12b electrically connected to each other.

As a result, as illustrated in FIG. 2A, the respective terminals 12b of the IC packet 12 are electrically conducted to the respective pairs of electrodes 15a, 15a of the wiring board 15 via the respective pairs of contact pins 14, 14.

In this condition, a current is applied to the IC packet 12 for burn-in test through Kelvin connection.

During the burn-in test or the like, if the upper contact member 22 of the contact pin 14 should rotate around the center CT1 of the barrel, the upper contact member 22 may possibly be detached from the terminal 12b of the IC packet 12. To address this problem, according to the IC socket 11, the two rotation stoppers 26 of the flange 20 of the barrel 21 are brought into contact with the inner surface of the slit 13b of the socket main body 13 when the contact pin 14 is disposed in the socket main body 13, whereby the barrel 21 and thus the upper contact member 22 are restrained from rotating relative to the socket main body 13. This can implement rotation stoppage for the contact pin 14.

As this rotation stoppage for the contact pin 14 is implemented through contriving the shape of the flange 20 of the barrel 21, it is unnecessary to make the upper contact member 22 and/or the lower contact member 23 into a particular shape (a shape like a knife, for example) in manufacturing of the contact pin 14. Hence, this can ensure a lower manufacturing cost of the contact pin 14.

Moreover, the IC socket 11 can be readily made by making the upper guide hole 13a of the socket main body 13, where the upper contact member 22 of the contact pin 14 is to penetrate, so as to have a substantially round cross section in manufacturing of the IC socket 11. Hence, this also contributes to a lower manufacturing cost of the IC socket 11, as compared with a conventional IC socket that requires an upper guide hole 13a having a substantially rectangular cross section.

Furthermore, as the flange 20 of the barrel 21 of the contact pin 14 has two flat rotation stoppers 26 formed at respective positions that hold a point symmetrical positional relationship relative to the center CT1 of the barrel 21, the flange 20 can be readily processed in manufacturing of the contact pin 14, as compared with a case in which only one rotation stopper 26 is formed.

Yet further, as the rotation stoppers 26 of the flange 20 of each of the two contact pins 14 of a pair of contact pins 14 are disposed so as to be opposed to each other, as described above, the barrel bodies 19 of the barrels 21 can be positioned close to each other. As a result, this makes such an IC socket 11 for Kelvin connection applicable even in the case of reduction in size of the terminals 12b of an IC package 12.

Other Embodiments of the Present Invention

In the first embodiment mentioned above, a contact pin 14 that causes both the two rotation stoppers 26 of the flange 20 to be brought into contact with the socket main body 13 to thereby implement rotation stoppage for the contact pin 14 has been described. The contact pin 14, however, does not always need to cause both the two rotation stoppers 26 of the flange 20 to be brought into contact with the socket main body 13 because the contact pin 14 will not move in the lateral direction even if the contact pin 14 should rotate as long as the upper and lower end portions (specifically, the upper contact member 22 and the lower contact member 23) of the contact pin 14 are supported by the socket main body 13. Thus, it is possible to implement rotation stoppage for the contact pin 14 by causing only one of the two rotation stoppers 26 to be brought into contact with the socket main body 13. In this case, the two contact pins 14 of a pair of contact pins 14 can be positioned as close as possible to, but not in contact with, each other even with a separating wall 13e (see FIG. 2A) for preventing short-circuiting between the pair of contact pins 14, omitted. This can further increase the applicability of such an IC socket 11 for Kelvin connection in the case of reduction in size of the terminals 12b of an IC package 12.

In the first embodiment mentioned above, a contact pin 14 having two flat rotation stoppers 26 on the flange 20 of the barrel 21 has been described. The rotation stopper 26, however, is not necessarily flat. Moreover, the number of the rotation stoppers 26 is not necessarily two. One or three or more of the rotation stoppers 26 may be provided.

In the first embodiment mentioned above, a one-end slidable contact pin 14 (that is, the upper contact member 22 is secured to the barrel 21 and the lower contact member 23 is held so as to move in the up-down direction relative to the barrel 21) has been described. Alternatively, the present invention can be similarly applied to a both-end slidable contact pin (that is, both the upper contact member 22 and the lower contact member 23 are held so as to move in the up-down direction relative to the barrel 21). That is, the present invention is similarly applicable to a contact pin 14 of which at least one of the upper contact member 22 and the lower contact member 23 is slidable in the up-down direction relative to the barrel 21.

In the first embodiment mentioned above, an IC socket 11 for Kelvin connection in which a pair of contact pins 14 is disposed in the socket main body 13 has been described. Besides this type of IC sockets 11 for Kelvin connection, the present invention can be applied to an IC socket for larger current in which, for example, a plurality of pairs of contact pins 14, 14 are disposed so as to be parallel to each other in the socket main body 13 and, in each pair of contact pins 14, the upper contact members 22 of the two contact pins 14 are simultaneously brought into contact with one terminal 12b of the IC packet 12, and the lower contact members 23 of the two contact pins 14 are brought into contact with one electrode 15a of the wiring board 15. Still alternatively, the present invention can be applied also to an IC socket in which individual contact pins 14, rather than pairs of contact pins 14, 14, are disposed in the socket main body 13.

Although the present invention is applied to an IC socket 11 as an "electric component socket" in the first embodiment mentioned above, this is not an exclusive example and, naturally, the present invention can be applied to any other types of devices.

REFERENCE SIGNS LIST

11 . . . IC socket (electric component socket)
12 . . . IC package (electric component)
12b . . . terminal
13 . . . socket main body
13a . . . upper guide hole (guide hole)
13b . . . slit
14 . . . contact pin
15 . . . wiring board
19 . . . barrel body
19a . . . one opening
19b . . . the other opening
20 . . . flange
21 . . . barrel
22 . . . upper contact member
22a . . . upper contact portion
23 . . . lower contact member
23a . . . lower contact portion
24 . . . coil spring (urging means)
25 . . . flange main body
26 . . . rotation stopper
CT1 . . . the center of the barrel

The invention claimed is:

1. An electric component socket comprising:
a socket main body; and
a contact pin disposed in the socket main body, for electric connection between an electric component and a wiring board according to a Kelvin connection,
the contact pin including,
a barrel having a flange formed on an outer circumference of a barrel body of the barrel;
an upper contact member provided to one opening of the barrel body of the barrel so as not to rotate, for contacting an electrode of the electric component; and
a lower contact member provided to another opening of the barrel body of the barrel, for contacting a terminal of the wiring board,
wherein
the flange has a flange main body that has a substantially annular tabular shape and forms a rotation stopper that protrudes in a horizontal direction,
the rotation stopper has two end faces that protrude in the horizontal direction and which are formed by cutting portions off from both sides of peripheral portions of the flange main body,
the rotation stopper forbids the barrel to rotate with respect to the socket main body by making the end faces hit against an inner wall surface of the socket main body,
the contact pin is disposed neighboring a neighbor contact pin in the socket main body,
one of the end faces of the rotation stopper is disposed to face one of neighboring end faces of a neighboring rotation stopper of the neighboring contact pin such that the upper contact member of the contact pin is disposed in close proximity with a neighboring upper contact member of the neighboring contact pin, and
the upper contact member contacts the electrode of the electric component together with the neighboring upper contact member of the neighboring contact pin to cause the Kelvin connection.

2. The electric component socket according to claim 1, wherein
at least one of the upper contact member and the lower contact member of the contact pin is movable in an up-down direction relative to the barrel, and
the contact pin further comprises urging member held inside the barrel body of the barrel, the urging member urging the upper contact member and the lower contact member of the contact pin in respective mutually separating directions.

3. The electric component socket according to claim 2, wherein
the socket main body includes a stepped portion on which an upper surface of the flange is to be abutted and a slit having the inner wall surface with which the rotation stopper of the flange is to be brought into contact, and
the flange is configured such that the flange abuts on the stepped portion of the socket main body to thereby regulate upward movement of the upper contact member of the contact pin and that the rotation stopper of the flange abuts on the inner wall surface of the slit to thereby restrain rotation of the barrel.

4. The electric component socket according to claim 1, wherein the contact pin and the neighboring contact pin are disposed so as to be parallel to each other in the socket main body so that the upper contact member and the neighboring upper contact member of the neighboring contact pin are brought into contact with the electrode, which is a single electrode, of the electric component.

5. The electric component socket according to claim 4, wherein the upper contact member of the contact pin and the neighboring upper contact member of the neighboring contact pin are disposed such that the one of the end faces of the rotation stopper and the one of the neighboring end faces of the neighboring rotation stopper are parallel to each other.

6. The electric component socket according to claim 1, wherein the contact pin includes,
an upper contact portion formed on an upper portion of the upper contact member of the contact pin, and
a lower contact portion formed on a lower portion of the lower contact member of the contact pin.

7. The electric component socket according to claim 1, wherein the end faces formed at both sides of the peripheral portions of the flange main body are formed at respective positions that hold a point that is a symmetrical positional relationship relative to a center of the barrel.

* * * * *